United States Patent
Oh et al.

(10) Patent No.: US 7,174,140 B2
(45) Date of Patent: Feb. 6, 2007

(54) RF SYSTEM INTEGRATED WITH RF SWITCH AND RF MODULATION

(75) Inventors: Duck Su Oh, Gwangju (KR); Yong Kyu Kim, Gwangju (KR)

(73) Assignee: LG Innotek Co., Ltd, Seoul (KR)

( * ) Notice: Subject to any disclaimer, the term of this patent is extended or adjusted under 35 U.S.C. 154(b) by 271 days.

(21) Appl. No.: 10/835,192

(22) Filed: Apr. 30, 2004

(65) Prior Publication Data
US 2004/0203546 A1  Oct. 14, 2004

Related U.S. Application Data

(63) Continuation of application No. PCT/KR02/02115, filed on Nov. 12, 2002.

(30) Foreign Application Priority Data
Nov. 13, 2001  (KR) .................. 10-2001-0070358

(51) Int. Cl.
*H04B 1/18* (2006.01)
(52) U.S. Cl. .................. 455/150.1; 455/21; 455/562.1
(58) Field of Classification Search .................. 455/18, 455/20–22, 73, 78, 562.1, 130, 133; 725/133, 725/109; 348/725, 726, 150, 165
See application file for complete search history.

(56) References Cited

U.S. PATENT DOCUMENTS

| | | | | |
|---|---|---|---|---|
| 4,405,946 A | | 9/1983 | Knight | |
| 5,797,083 A | * | 8/1998 | Anderson | 455/25 |
| 6,550,063 B1 | * | 4/2003 | Matsuura | 725/133 |
| 2001/0037510 A1 | * | 11/2001 | Lee | 725/109 |
| 2002/0140871 A1 | * | 10/2002 | Piotrowski et al. | 348/731 |

FOREIGN PATENT DOCUMENTS

JP  10-290403 A  10/1998

* cited by examiner

*Primary Examiner*—George Eng
*Assistant Examiner*—Phuoc Doan
(74) *Attorney, Agent, or Firm*—Edell, Shapiro & Finnan, LLC

(57) ABSTRACT

An RF system integrated with an RF switching unit and an RF modulator unit. In accordance with the present invention, it is provided the RF system including a plurality of antenna, an RF unit and a digital tuner and demodulator unit, includes a plurality of RF input terminals connected with the respective antenna; an RF relay for selectively outputting RF signal inputted to the plurality of RF input terminals on the basis of control signal; an RF amplifier for amplifying RF signal outputted from the RF relay; an RF signal distributor for distributing RF signal amplified and outputted from the RF amplifier; an RF modulator for receiving and modulating signal outputted from the digital tuner and demodulator unit connected with the RF signal distributor to output RF signal; an RF selection switch for selectively outputting at least one of RF signal outputted from the RF signal distributor and RF signal outputted from the RF modulator on the basis of control signal; and an RF output terminal for outputting signal from the RF selection switch.

16 Claims, 5 Drawing Sheets

RF SYSTEM INTEGRATED WITH RF SWITCH AND RF MODULATION

CROSS REFERENCE TO RELATED APPLICATIONS

This application is a continuation of PCT Application No. PCT/KR2002/002115, filed on Nov. 12, 2002, and titled "Rf System Integrated With Rf Switch And Rf Modulation," which claims priority from Korean Patent Application No. 10-2001-70358, filed on Nov. 13, 2001, and titled "Rf System Integrated With Rf Switch And Rf Modulation," the entire contents of which are hereby incorporated by reference.

TECHNICAL FIELD

The present invention relates to an RF system integrated with an RF switch and an RF modulator unit.

BACKGROUND ART

Generally, as shown in FIG. 1, a conventional RF system, which is used for a multimedia receiver (Set Top Box) for receiving digital broadcast, terrestrial broadcast, satellite broadcast, etc., consists of a plurality of antenna 21 and 22, an RF switching unit 30 and an RF modulator unit 40, wherein the RF switching unit 30 and the RF modulator unit 40 are separated from each other.

The plurality of antenna 21 and 22 receive an inputted RF signal, respectivnely, such as the digital broadcast, terrestrial broadcast, satellite broadcast, etc.

The RF switching unit 30 includes a plurality of input terminals 31 and 32 connected to the respective antenna 21 and 22, an RF relay 33 for switching and selectively outputting RF signal, which have been inputted to the plurality of RF input terminals 31 and 32, on the basis of RF relay control signal inputted from the outside, a first RF amplifier 34 for amplifying RF signal outputted from the RF relay 33, and an RF signal distributor 35 for distributing RF signal amplified and outputted from the first RF amplifier 34.

The RF modulator unit 40 includes an RF input terminal 41 connected to the RF signal distributor 35 within the RF switching unit 30, a second RF amplifier for amplifying RF signal inputted to the RF input terminal 41, an RF modulator 43 for receiving and modulating digital video/audio signal outputted from a digital tuner and demodulator unit 50 within a receiver, which tunes/demodulates inputted RF signal, an RF selection switch 44 for selectively transferring RF signal amplified and outputted from the second RF amplifier 42 or analog tuning signal outputted from the RF modulator 43, and an RF output terminal 45 for outputting signal from the RF selection switch 44.

The operation of such the conventional RF system, in which the RF switching unit and the RF modulator unit are separated from each other as described above, will now be described in detail with reference to FIG. 1.

If the RF relay 33 is switched according to the RF relay control signal to selectively supply the RF signal inputted through the respective antenna 21 and 22 to the first RF amplifier 34, the first RF amplifier 34 amplifies and outputs the RF signal to the RF signal distributor 35.

The RF signal distributor 35 distributes the RF signal inputted thereto. One distributed RF signal is transferred to the RF modulator unit 40, and the other distributed RF signal is transferred to the digital tuner and demodulator unit 50.

The RF signal inputted to the RF modulator unit 40 is amplified by the second RF amplifier 42. At this time, as shown in FIG. 1, if the RF selection switch 44 connects the second RF amplifier 42 to the RF output terminal 45, the amplified RF signal is outputted directly through the RF output terminal 45.

On the other hand, if the RF selection switch 44 connects the RF modulator 43 to the RF output terminal 45, the digital audio/video signal modulated in the RF modulator 43 is outputted through the RF output terminal 45.

At this time, the RF modulator 43 receives the audio/video signal detected in the digital tuner and a demodulator unit 50 (or analog tuner and demodulator unit), and modulates them to a particular analog channel broadcast to output RF signal.

However, in the conventional RF system, in which the RF switching unit and the RF modulator unit are separated from each other, the RF switching unit and the RF modulator unit are constructed in each separated block, respectively. Such construction causes a performance deterioration due to a signal loss or generation of a noise signal resulting from use of same devices (for example, RF amplifier) among the respective block as well as from matching input/output impedance to the respective block.

The conventional RF system of the above construction has another problem of relatively enlarging a product size due to the independent blocks of the RF switch unit and the RF demodulator unit.

DISCLOSURE OF INVENTION

It is, therefore, an object of the present invention to provide an RF system, in which an RF switching unit and an RF modulator unit are integrated into one module, thereby preventing deterioration of performance due to a signal loss and generation of a noise signal resulting from using same devices as well as from matching input/output impedance, and relatively minimizing size of the product.

It is another object of the present invention to minimize influence of non-selected signal to selected signal by selecting inputs of multi-signal with the RF switching unit and cutting off the non-selected signal.

An RF system integrating an RF switching unit with a modulator unit according to the present invention including a plurality of antenna, an RF unit and a digital tuner and a demodulator unit includes: a plurality of RF input terminals connected to the respective antenna; an RF relay for selectively outputting RF signal inputted to the plurality of RF input terminals on the basis of a control signal; an RF amplifier for amplifying RF signal outputted from the RF relay; an RF signal distributor for distributing RF signal amplified and outputted from the RF amplifier; an RF modulator for receiving and modulating signal outputted from the digital tuner and demodulator unit connected to the RF signal distributor to output RF signal; an RF selection switch for selectively outputting at least one of RF signals outputted from the RF signal distributor and the RF modulator on the basis of control signals; and an RF output terminal for outputting signal from the RF selection switch.

The RF system integrating an RF switching unit with a demodulator unit according to the present invention further includes: an RF relay for selectively outputting RF signal inputted to the plurality of RF input terminals on the basis of control signals; an RF signal distributor for distributing RF signal outputted from the RF relay; an RF modulator for receiving and modulating signal outputted from the digital tuner and demodulator unit connected with the RF signal distributor to output RF signal; an RF selection switch for selectively outputting at least one of RF signals outputted from the RF signal distributor and the RF modulator on the basis of control signals; and an RF output terminal for outputting signal from the RF selection switch.

The RF system integrating and RF switch unit with a demodulator unit according to the present invention further includes: a plurality of input terminals connected to the respective antenna; an RF relay for selectively outputting RF signal inputted to the plurality of RF input terminals on the basis of control signals; a first RF amplifier for amplifying RF signal outputted from the RF relay; a first RF signal distributor for distributing RF signal amplified and outputted from the RF amplifier; a second RF amplifier for amplifying RF signal outputted from the first RF signal distributor; a second RF signal distributor for amplifying RF signal amplified and outputted from the second RF amplifier; an RF modulator for receiving and modulating signal outputted from the digital tuner and demodulator unit connected to the first and second RF signal distributors to output RF signal; an RF selection switch for selectively outputting at least one of RF signal outputted from the second RF signal distributor and the RF modulator on the basis of control signals; and an RF output terminal for outputting signal from the RF selection switch.

Accordingly, the present invention provides an RF switch-integrated modulation circuit, wherein an RF switching unit and an RF modulator unit are integrated into one module, thereby preventing deterioration of performance due to a signal loss and generation of noise signal resulting from use of same devices as well as from matching input/output impedance, and relatively minimizing size of the product.

In addition, it is possible to minimize the influence of the non-selected signal to the selected signal by selecting the inputs of the multi-signal with the RF switching unit and cutting off the non-selected signal.

BRIEF DESCRIPTION OF DRAWINGS

The above objects, features and advantages of the present invention will become more apparent from the following detailed description when taken in conjunction with the accompanying drawings, in which.

BEST MODES FOR CARRYING OUT THE INVENTION

The construction of an RF system integrating an RF switching unit with an RF modulator unit in accordance with the present invention will now be described in detail with reference to FIG. 2.

Figure 1:
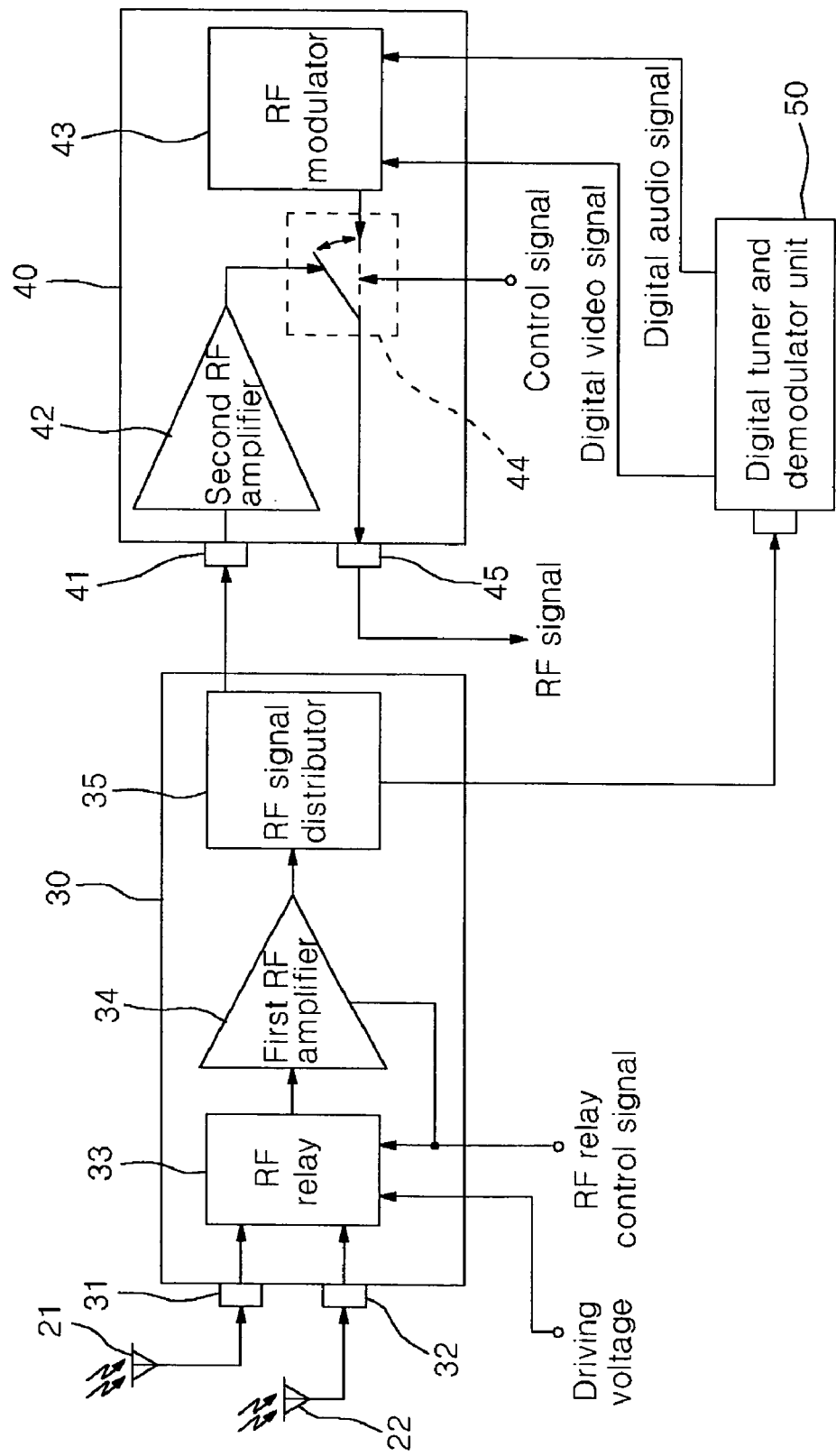
FIG. 1 is a block diagram schematically showing the construction of a conventional RF system in which an RF switching unit and an RF modulator unit are separated from each other.
Figure 2:
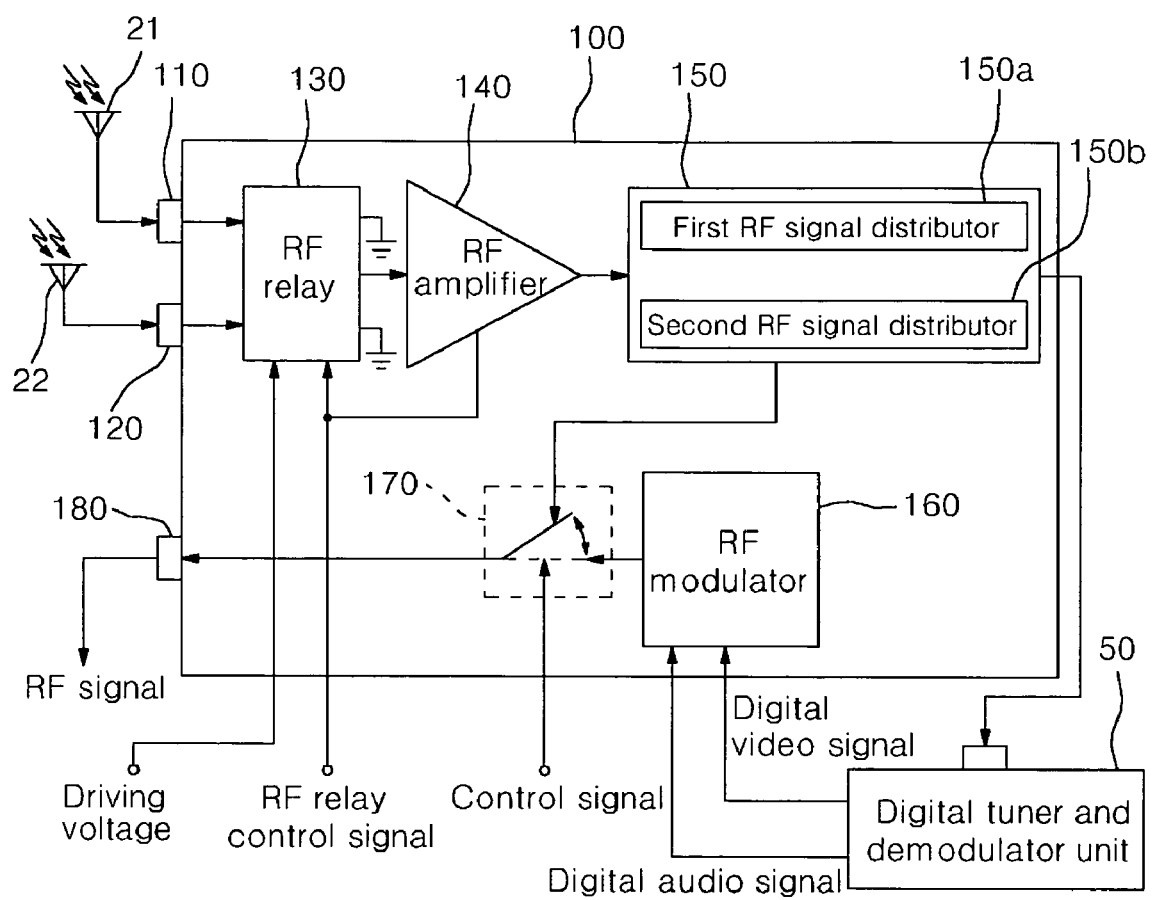
FIG. 2 is a block diagram schematically showing the construction of an RF system integrating an RF switching unit with an RF modulator unit in accordance with one embodiment of the present invention.

In FIG. 2, the same elements as those of the RF system in FIG. 1 will be denoted by the same reference numerals, and no detailed description thereof will be provided.

FIG. 2 is a block diagram schematically showing the construction of an RF system integrating an RF switching unit with an RF modulator unit in accordance with one embodiment of the present invention.

Referring to FIG. 2, the RF system 100 integrating the RF switching unit with the RF modulator unit in accordance with the present invention includes a plurality of RF input terminals 110 and 120, an RF relay 130, a first RF amplifier 140, one or more RF signal distributors 150, an RF modulator 160, an RF selection switch 170, and an RF output terminal 180.

The plurality of RF input terminals 110 and 120 are connected to antenna 21 and 22, respectively.

The RF relay 130 switches and selectively outputs RF signal inputted to the plurality of RF input terminals 110 and 120 on the basis of the RF relay control signal inputted from the outside.

The RF relay 130 selects a particular signal among the multi-signal and prevents the non-selected signal from streaming-in thereto.

The first RF amplifier 140 amplifies RF signal outputted from the RF relay 130.

The RF signal distributor 150 distributes RF signal amplified and outputted from the first RF amplifier 140.

The RF signal distributor consists of RF signal distributors 150a and 150b.

The RF modulator 160 receives digital (or analog) video/audio signal outputted from a digital tuner and demodulator unit 50 (or analog tuner and demodulator unit) and modulates them to a particular analog channel broadcast to output RF signal.

The RF selection switch 170 selectively transfers the RF signal outputted from the RF signal distributor 150 or the RF signal outputted from the RF modulator 160 on the basis of the external control signals (not shown in the drawing).

The RF output terminal 180 outputs the signal from the RF selection switch 170.

Now, the operation of the RF system integrating an RF switching unit with the RF modulator unit in accordance with the present invention will be described in detail with reference to FIG. 2.

First, the RF relay 130 is switched on the basis of the RF relay control signals to selectively supply the RF signal inputted through the respective antenna 21 and 22 to the first RF amplifier 140. Then, the first RF amplifier 140 amplifies the RF signal and supplies them to the RF signal distributor 150.

At this time, the RF relay 130 passes only the signal streamed-in through a particular antenna to the first RF amplifier 140 on the basis of the RF relay control signals and cuts off signal streamed-in through the other antenna in beforehand, thereby preventing the signal streamed-in through the other antenna from influencing the signal streamed-in through the selected particular antenna.

The RF signal distributor 150 distributes the inputted RF signal thereto. One distributed RF signal is transferred to the RF selection switch 170 and the other distributed RF signal is transferred to the digital tuner and demodulator unit 50.

As shown in FIG. 2, in the case that the RF selection switch 170 is connected with the RF output terminal 180, the signal transferred to the RF selection switch 170 are outputted directly through the RF output terminal 180.

Meanwhile, in the case that the RF selection switch 170 connects the RF modulator 160 with the RF output terminal 180, digital audio/video signal modulated in the RF modulator 160 are outputted through the RF output terminal 180.

At this time, the RF modulator 160 receives the audio/video signal detected from the digital tuner and demodulator unit 50 (or analog tuner and demodulator unit) and modulates them to the particular analog channel broadcast to output the RF signal.

Accordingly, the number of using same devices is excluded and the volume of the circuit is minimized by integrating the RF switch and the RF modulator into one module. Therefore, it is possible to prevent the performance deterioration due to the signal loss and the noise signal generation in beforehand.

Also, because the RF relay passes only the signal streamed-in through the particular antenna to the RF modulator, it is possible to prevent the non-selected signal from influencing the selected signal when the multi-signal is inputted.

Figure 3:
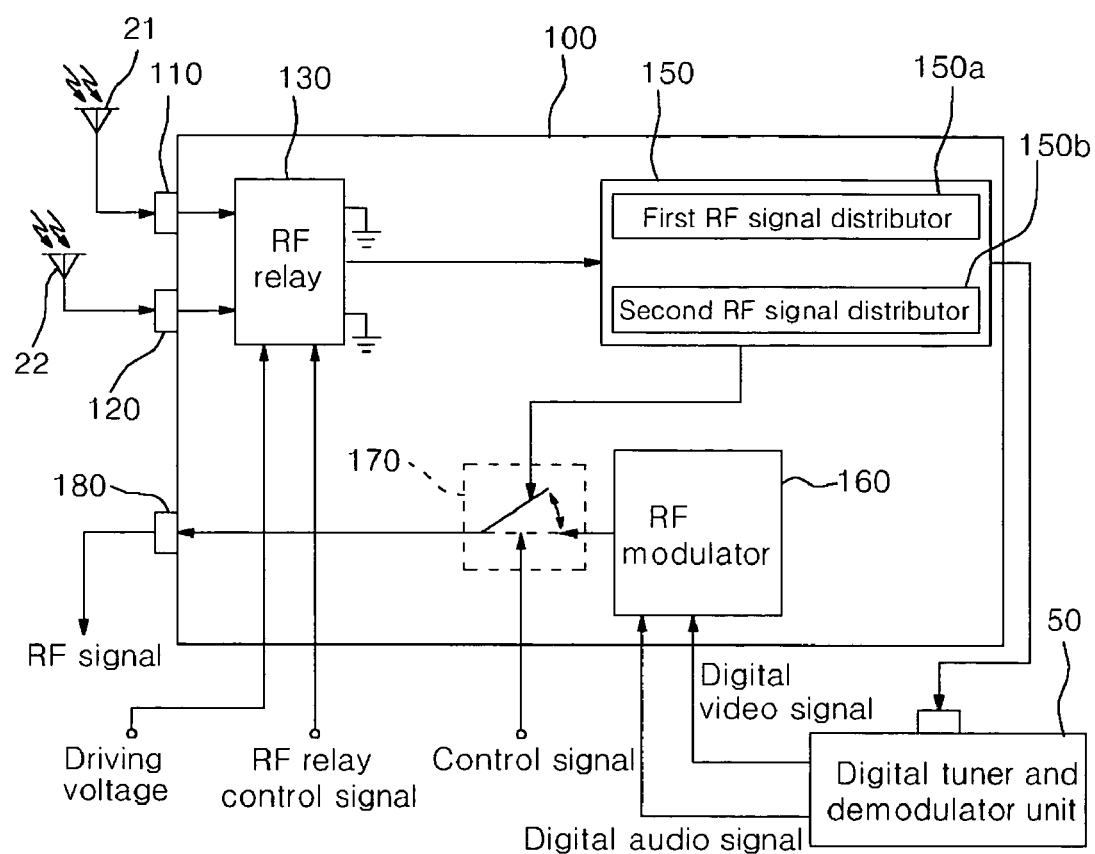
FIG. 3 is a block diagram schematically showing the construction of an RF system integrating an RF switching unit with an RF modulator unit in accordance with another embodiment of the present invention.

FIG. 3 is a block diagram schematically showing the construction of an RF system integrated with an RF switching unit and an RF modulator unit in accordance with the other embodiment of the present invention.

The construction shown in FIG. 3 is basically same with that of FIG. 2, but it is different in that the RF signal selected and outputted from the RF relay unit 130 are inputted directly to the RF distributor 150 without being amplified.

Figure 4:
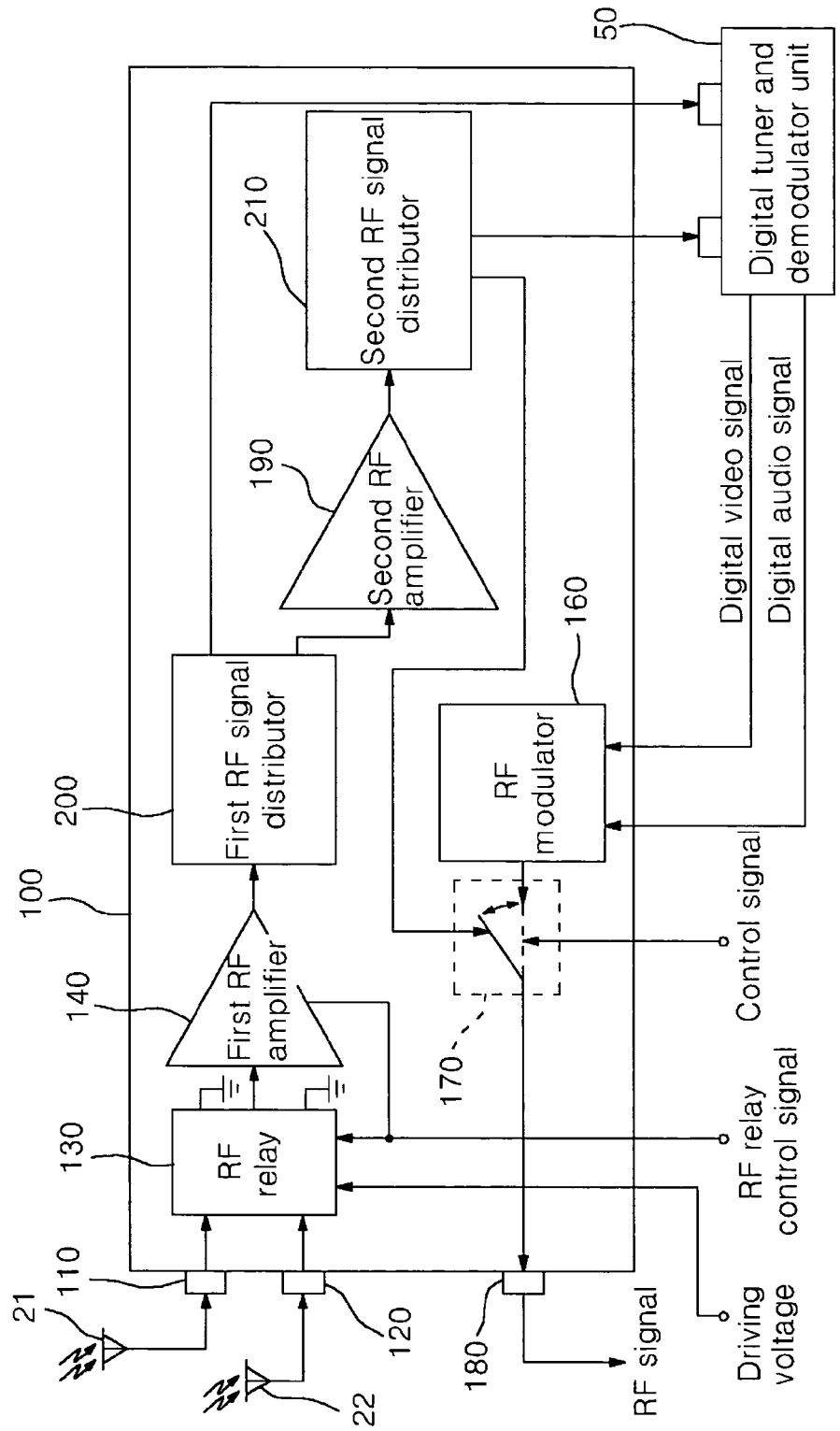
FIG. 4 is a block diagram schematically showing the construction of an RF system integrating an RF switching unit with an RF modulator unit in accordance with another embodiment of the present invention.

FIG. 4 is a block diagram schematically showing the construction of an RF system integrated with an RF switching unit and an RF modulator unit in accordance with another embodiment of the present invention.

The construction shown in FIG. 4 is basically same with that of FIG. 2, but it is different in that the RF signal selected and outputted from the RF relay unit 130 are amplified in the first RF amplifier 140 and then inputted to a first RF signal distributor 200, and the signal outputted from the first RF signal distributor is inputted to the digital tuner and demodulator unit 50 and a second RF amplifier 190.

The signal amplified by the second RF amplifier 190 is inputted to a second RF signal distributor 210 and then outputted to the selection switch 170.

Hereinafter, the construction of FIG. 4 will be described in detail.

In FIG. 4, the signal selected from the RF relay unit 130 on the basis of the RF relay control signals are outputted and the outputted signal is amplified through the first RF amplifier 140 and the second RF amplifier 190, as described above in reference with FIG. 2.

Meanwhile, in the present invention, a sufficient isolation must be ensured between the signal (terrestrial signal, cable signal) streamed-in to an antenna input and the output signal (from the RF signal distributor and the RF distributor).

This is because in the case that the non-selected signal from the RF relay unit are inputted to a ground or a signal output line, the non-selected signal influence the selected signal outputs, which acts to generate noise on a digital TV screen. Particularly, if the electric field streamed-in to the antenna input is stronger, the noise maybe appear with serious.

Accordingly, the present invention is constructed to sufficiently ensure isolation among the antenna input terrestrial signal, the cable signal and the output signal, an isolation between the outputs from the RF modulator and the antenna input signal, and an isolation between the outputs from the RF modulator and the signal inputted and outputted to/from the antenna input.

As described above, while the selected signal from the RF relay unit 130 are inputted to the digital tuner and demodulator unit, the digital tuner and demodulator unit may generate interference among the digital tuners when the digital tuner and demodulator are operated simultaneously. At this time, the second RF amplifier 190 is required for removing the interference among the digital tuners.

Figure 5:
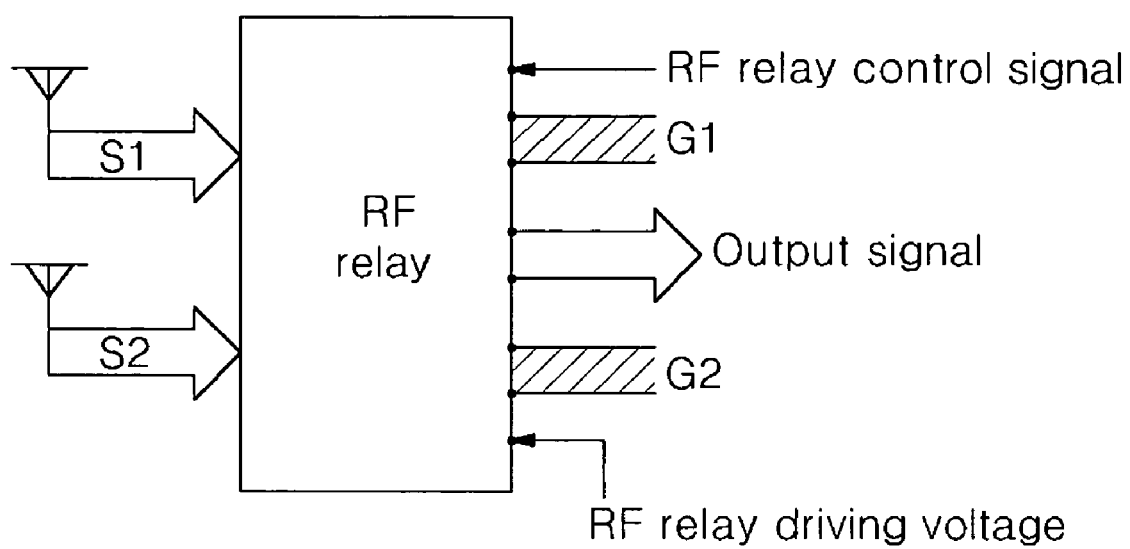
FIG. 5 is a diagram showing signal flows inputted and outputted to/from an RF relay unit of the present invention and grounded states of the RF relay unit.

FIG. 5 is a diagram showing the signal inputted and outputted to/from the RF relay unit of the present invention and grounded states of the RF relay unit. FIG. 5 shows the construction for ensuring the isolation among the signal described above in reference with FIG. 4.

As shown in FIG. 5, patterns S1 and S2 of two input signal lines applied to the antenna inputs must have 4 mm or more thickness for matching input impedance of high frequency signal and the output line of the selected signal from the RF relay unit must also have 4 mm or more thickness for matching output impedance.

Meanwhile, a pattern design having 5 mm or more interval is required to ensure an isolation of the input signal and the output signal from grounds G1 and G2 to which the non-selected signal components from the RF relay unit are outputted.

In the case that the intervals between the selected output signal lines from the RF relay unit and the grounds G1 and G2 are too close or far, the non-selected signal components from the RF relay may be streamed to the selected signal output line. This deteriorates the isolation between the input and the output. Therefore, the patterns between the output line and the grounds G1 and G2 must be formed to maintain constant intervals.

While the invention has been shown and described in reference with certain preferred embodiments thereof, it will be understood by those skilled in the art that various changes in form and details may be made therein without departing from the spirit and scope of the invention as defined by the appended claims.

What is claimed is:

1. An RF system in a multimedia receiver including a plurality of antennas and a digital tuner and demodulator unit, the RF system comprising:

a plurality of RF input terminals each connected to a corresponding one of the plurality of antennas;

an RF relay for selectively outputting an RF signal input to one of the plurality of RF input terminals on the basis of control signals;

an RF amplifier for amplifying an RF signal output from the RF relay;

an RF signal distributor comprising a first RF signal distributor and a second RF signal distributor for distributing the RF signal amplified and output from the RF amplifier to produce a plurality distributed RF signals, wherein the digital tuner and demodulator unit receives one of the plurality of distributed RF signals and produces an output signal;

an RF modulator for receiving and modulating the output signal from the digital tuner and demodulator unit to produce an RF signal as output;

an RF selection switch for selectively outputting at least one of the other distributed RF signals output from the RF signal distributor and the RF signal output from the RF modulator on the basis of a control signal; and an RF output terminal for outputting the signal selectively output from the RF selection switch.

2. The RF system according to claim 1, wherein the RF relay selects a particular signal among a plurality of signals supplied to the plurality of RF input terminals and prevents non-selected signals from streaming-in thereto.

3. The RF system according to claim 2, wherein the RF relay directs the non-selected signals to grounds that are spaced by 5 mm or more in order to ensure an isolation between the non-selected signals and the particular signal.

4. The RF system according to claim 1, wherein the RF relay directs signals connected to RF input terminals that are not selected to grounds that are spaced by 5 mm or more in order to ensure an isolation between non-selected signals and a selected signal.

5. The RF system according to claim 1, and further comprising patterns of two input signal lines between each RF input terminal and the RF relay, wherein the two input signal lines are formed to have 4 mm or more thickness for matching an input impedance of a high frequency signal.

6. The RF system according to claim 1, and further comprising output lines connected between the output of the RF relay and the RF signal distributor, wherein the output lines are formed to have 4 mm or more thickness for matching an output impedance.

7. The RF system according to claim 1, wherein the digital tuner and demodulator unit output as its output signal a digital video/audio signal, and the RF modulator receives the digital video/audio signal and modulates the digital video/audio signal to a particular analog channel broadcast to output an RF signal.

8. The RF system according to claim 1, wherein the RF switch and the RF modulator are integrated into one module.

9. An RF system in a multimedia receiver including a plurality of antenna, and a digital tuner and demodulator unit, the RF system comprising:
   a plurality of RF input terminals each connected to a corresponding one of the plurality of antennas;
   an RF relay for selectively outputting an RF signal input to one of the plurality of RF input terminals on the basis of control signals;
   an RF signal distributor comprising a first RF signal distributor and a second RF signal distributor for distributing the RF signal output from the RF relay to produce a plurality distributed RF signals, wherein the digital tuner and demodulator unit receives one of the plurality of distributed RF signals and produces an output signal;
   an RF modulator for receiving and modulating the output signal from the digital tuner and demodulator unit to produce an RF signal as output;
   an RF selection switch for selectively outputting at least one of the other distributed RF signals output from the RF signal distributor and the RF signal output from the RF modulator on the basis of a control signal; and
   an RF output terminal for outputting the signal selectively output from the RF selection switch.

10. The RF system according to claim 9, wherein the RF switch and the RF modulator are integrated into one module.

11. The RF system according to claim 9, wherein the RF relay directs the non-selected signals to grounds that are spaced by 5 mm or more in order to ensure an isolation between the non-selected signals and a selected signal.

12. The RF system according to claim 9, and further comprising patterns of two input signal lines between each RF input terminal and the RF relay, wherein the two input signal lines are formed to have 4 mm or more thickness for matching an input impedance of a high frequency signal.

13. The RF system according to claim 9, and further comprising output lines connected between the output of the RF relay and the RF signal distributor, wherein the output lines are formed to have 4 mm or more thickness for matching an output impedance.

14. An RF system in a multimedia receiver including a plurality of antennas and a digital tuner and demodulator unit, the RF system comprising:
   plurality of RF input terminals each connected to a corresponding one of the plurality of antennas;
   an RF relay for selectively outputting an RF signal input to one of the plurality of RF input terminals on the basis of control signals;
   a first RF amplifier for amplifying an RF signal output from the RF relay;
   a first RF signal distributor for distributing the RF signal amplified and output from the first RF amplifier to produce a first plurality of distributed RF signals;
   a second RF amplifier for amplifying one of the RF signals output from the first RF signal distributor;
   a second RF signal distributor for distributing the RF signal amplified and output from the second RF amplifier to produce a second plurality of distributed RF signals;
   wherein the digital tuner and demodulator unit receives one of the first plurality of distributed RF signals and one of the second plurality of distributed RF signals and produces at least one output signal
   an RF modulator for receiving and modulating the output signal from the digital tuner and demodulator unit to produce an RF signal as output;
   an RF selection switch for selectively outputting at least one of the second plurality of distributed RF signals output from the second RF signal distributor and the RF signal output by the RF modulator on the basis of control signals; and
   an RF output terminal for outputting the signal selectively output from the RF selection switch.

15. The RF system according to claim 14, wherein the second RF amplifier reduces interference generated in the case in which the distributed RF signals output from the first and second distributors are to and operated on by the digital tuner.

16. The RF system according to claim 14, wherein the RF switch and the RF modulator are integrated into one module.

* * * * *

UNITED STATES PATENT AND TRADEMARK OFFICE
CERTIFICATE OF CORRECTION

| | |
|---|---|
| PATENT NO. | : 7,174,140 B2 |
| APPLICATION NO. | : 10/835192 |
| DATED | : February 6, 2007 |
| INVENTOR(S) | : Duck Su Oh et al. |

It is certified that error appears in the above-identified patent and that said Letters Patent is hereby corrected as shown below:

Col. 1, lines 8 and 11:     "tided" should be --titled--

Col. 6, line 46 second occurrence:     "an RF signal" should be --the RF signal--

Signed and Sealed this

Twenty-seventh Day of May, 2008

JON W. DUDAS
*Director of the United States Patent and Trademark Office*